United States Patent
Qualich et al.

[11] Patent Number: 5,119,265
[45] Date of Patent: Jun. 2, 1992

[54] SEMICONDUCTOR DEVICE PROTECTION CIRCUIT

[75] Inventors: John R. Qualich, Wheeling, Ill.; Stephen P. Robb, Tempe; John M. Pigott, Phoenix, both of Ariz.

[73] Assignee: Motorola, Inc., Schaumburg, Ill.

[21] Appl. No.: 502,716

[22] Filed: Apr. 2, 1990

[51] Int. Cl.⁵ ............................................. H02H 5/04
[52] U.S. Cl. .................................... 361/103; 361/18; 323/907
[58] Field of Search ................. 361/18, 79, 91, 103, 361/111; 323/907

[56] References Cited

U.S. PATENT DOCUMENTS

| | | | |
|---|---|---|---|
| 4,516,865 | 5/1985 | Hideo | 330/143 |
| 4,667,516 | 5/1987 | Schulz | 323/367 |
| 4,896,245 | 1/1990 | Qualich | 361/103 |
| 4,924,194 | 5/1990 | Opas | 330/289 |
| 4,937,697 | 6/1990 | Edwards et al. | 361/18 |

OTHER PUBLICATIONS

"High Side Driver FET Load-Dump Protection", by John Qualich, Motorola Technical Developments vol. 9, Aug. 1989, pp. 62-63.

"Built-in Protection Makes TEMPFET Resistant to Catastrophic Failures" by Miro Glogolja, Power Conversion & Intelligent Motion, Mar. 1989 pp. 19-23.

"Self-Thermal Protection Power MOSFETS", by Tsazaki, Y.; Yamauka, M. and Kawamuto, K.; IEEE Power Electronic Specialists Conference. Paper No. 880411, pp. 41-45 or 87CH2459-6, pp. 31-36.

"Prior Low Side FET Switch",m (Sketch) Feb. 21, 1990.

Primary Examiner—Steven L. Stephan
Assistant Examiner—Adolf D. Berhane
Attorney, Agent, or Firm—Phillip H. Melamed

[57] ABSTRACT

FET protection circuit (10; 100) senses the temperature of a FET (11) and, via a control circuit (24), increases FET conduction in response to sensed FET temperature exceeding a high temperature threshold (160° C.) close to the maximum rated junction temperature (175° C.) of the FET. This allows the FET to survive excessive drain-to-source voltages which occur during load dump conditions even when load dump is sensed by a zener diode (26) which initially turns on the FET. During load dump after a zener diode (26) turns on the FET, in response to sensing excessive FET temperature the FET is turned in harder so as to reduce the drain-to-source voltage ($V_{DS}$) and minimize power dissipation during load dump thereby protecting the FET. Normal overcurrent and maximum temperture turn off circuitry (44, 33, 60-63) is effectively overridden by high temperature threshold turn-on circuitry (50). Preferably, a majority of the control circuit (24) is provided on an integrated circuit, but an external resistor (31) allows effective adjustment of two temperature thresholds (150° C., 160° C.) above which control signals provided to the FET will be modified.

30 Claims, 3 Drawing Sheets

SEMICONDUCTOR DEVICE PROTECTION CIRCUIT

BACKGROUND OF THE INVENTION

1. Field of the Invention

The present invention relates to the general field of semiconductor device protection circuits wherein such circuits protect a semiconductor device by minimizing either applied voltage, through current and/or power dissipation so as to enable the device to survive. More particularly, the present invention is directed to protecting semiconductor devices, such as field effect transistors (FETs), so that they can survive excessive voltages, currents and/or power dissipation which may be produced during load dump conditions.

2. Description of the Prior Art

FETs which drive high current loads have been provided with protection circuits which turn the FET off if conditions such as overcurrent, excessive FET power dissipation or excessive FET temperature are detected. U.S. Pat. No. 4,896,245 to Qualich and pending U.S. patent application Ser. No. 07/355,228, filed May 22, 1989 to Edwards et al. are examples of such prior protection circuits. However, such protection circuits typically do not provide sufficient protection for the FET during load dump conditions during which substantial excessive voltages can be applied between the drain and source terminals potentially causing undesired avalanche breakdown of some internal junctions of the FET semiconductor device. This can occur regardless of the operation of the above noted turn-off circuits.

Some prior circuits use a zener diode connected between B+ and ground to limit the load dump overvoltage applied to a high current rated FET. However, this solution requires the use of high current rated components for the limiting circuitry, and therefore is undesirable.

Some FET protection circuits have utilized a zener diode connected between the drain and gate electrodes to protect the FET by turning the device on in response to a load dump voltage in excess of the zener diode breakdown voltage. However, such circuits may not provide sufficient protection since they can result in excessive FET power dissipation during repetitive switching of the FET on and off during the load dump transient. Pending U.S. patent application Ser. No. 07/484,313, filed Feb. 26, 1990 to Edwards proposes one solution to this problem by utilizing a capacitor as a supplementary supply of operative power to maintain the FET on during a load dump condition. However, such circuitry may require the use of a costly energy storage element, such as a large capacitor, which can't be provided on an integrated circuit, and many times this is undesirable. In addition, it maybe difficult to determine the end of the load dump transient condition such that the FET device only remains on during the existence of such a condition. Also, if a zener diode is directly connected between a FET's gate and drain electrodes and is used to turn on and maintain the FET on in response to load dump, the FET can be subject to failure due to excessive power dissipation during load dump. This is because a substantial drain to source voltage ($V_{DS}$) will exist during load dump due to the zener diode while a substantial current is passed through the FET device.

OBJECTS OF THE INVENTION

An object of the present invention is to provide an improved semiconductor device protection circuit which overcomes substantially all of the above noted problems of the previous protection circuits.

A more particular objection of the present invention is to provide an improved semiconductor device protection circuit which enables the semiconductor device to withstand load dump transient signals.

An additional object of the present invention is to provide an improved semiconductor device protection circuit in which semiconductor device temperature is used to protect the semiconductor device by increasing current conduction through the semiconductor device in response to the temperature of the semiconductor device being close to the maximum rated junction temperature of the semiconductor device.

A still further object of the present invention is to provide an improved semiconductor device protection circuit in which semiconductor device temperature above a temperature threshold is used to modify a control signal applied to the semiconductor device and wherein a majority of the the protection circuit is provided on an integrated circuit, while an external component is provided which allows external adjustment of the temperature above which the semiconductor device control signal will be modified in accordance with device temperature.

BRIEF DESCRIPTION OF THE DRAWINGS

The present invention can be better understood by reference to the drawings in which.

DESCRIPTION OF THE PREFERRED EMBODIMENTS

Figure 1:
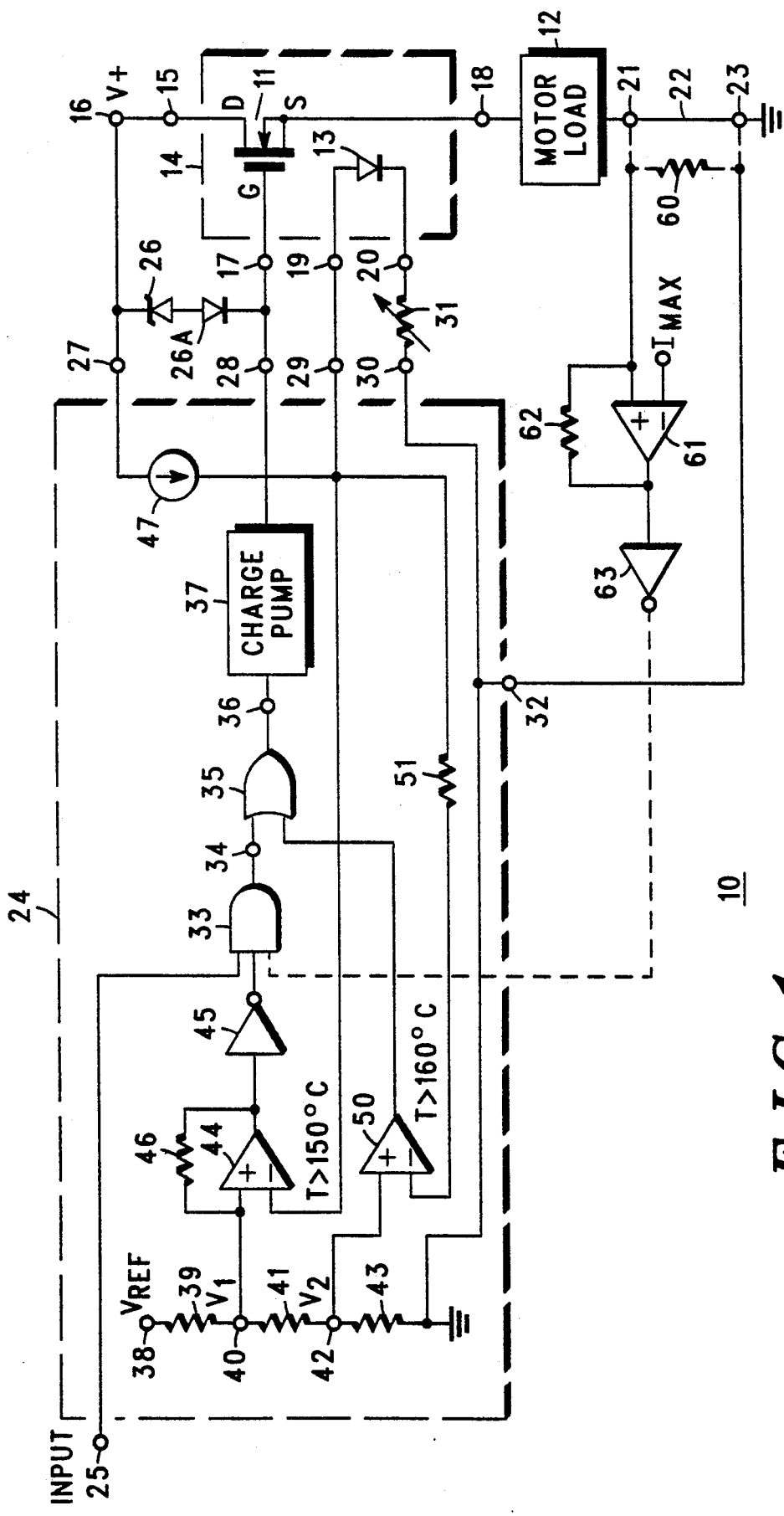
FIG. 1 is a schematic diagram of a semiconductor device protection circuit constructed in accordance with the present invention.

Referring to FIG. 1, a semiconductor device protection circuit 10 is illustrated which includes a semiconductor device 11, that forms a driver stage for controlling the current supplied to a low resistance, high current rated load 12. The device 11 preferably comprises a FET and the load 12 preferably comprises the windings of a motor. The FET 11, along with a polysilicon temperature sensing diode 13 are provided inside an integrated circuit module 14 (shown dashed in FIG. 1). The diode 13 is positioned adjacent the FET 11 such that the diode 13 will sense the temperature of the FET and produce a voltage thereacross substantially corresponding to the temperature of the FET due to close thermal coupling between the diode and the FET.

A drain electrode D of the FET 11 is connected to an external terminal 15 of the module 14 that is directly connected to a power supply terminal 16 at which a positive battery supplied power supply voltage V+ is provided. A gate electrode G of the FET is connected to an external input terminal 17 of the module 14 and a source electrode S of the FET is connected to an external terminal 18 of the module 14. Anode and cathode electrodes of the temperature sensing diode 13 are connected to external terminals 19 and 20 of the module 14, respectively. The terminal 18 is directly connected as a current input to the motor winding load 12 which has a terminal 21 connected through a direct wire connection 22 to a terminal 23 at which ground potential is provided.

Essentially, the FET 11 comprises a semiconductor device which receives at least one device control signal at its gate control electrode, corresponding to the terminal 17 and, in response thereto, selectively passes current through the FET 11 between a pair of output electrodes of the FET corresponding to the drain and source electrodes which correspond to the terminals 15 and 18, respectively. This current is provided to the motor load 12. The temperature sensing diode 13 comprises a temperature sense means which is thermally coupled to the FET 11 for developing a temperature sense signal across the diode 13 which has a magnitude indicative of the temperature of the FET.

The protection circuit 10 includes a control circuit 24 (shown dashed) which represents a plurality of electrical components provided on an integrated circuit (IC). The control circuit 24 is coupled to the temperature sensing diode 13 for receiving the temperature sense signal developed thereacross and selectively determining the device control signal provided at the terminal 17 in accordance with the temperature sense signal and in accordance with an external control signal received at an input terminal 25. Essentially, during normal operation the control circuit 24 responds to the external control signal at the terminal 25 to selectively control the on/off conduction of the FET 11 so as to provide current to the motor winding load 12 in accordance with the signal at the terminal 25. However, during certain conditions the control circuit 24 will modify the device control signal provided at the terminal 17 so as to protect the FET 11 and prevent destruction of this device due to certain conditions, including load dump. The term "load dump" refers to a transient condition wherein an exceptionally higher than normal voltage is provided at the terminal 16 wherein such voltage is large enough to cause excessive power dissipation in the FET 11 due to undesired avalanche breakdown of semiconductor junctions in the FET. This undesired breakdown can result in excessive power dissipation and permanent destruction of the FET. The present invention contemplates selectively turning the FET on during a load dump condition to allow the FET to survive the load dump transient condition. This is implemented in accordance with sensed FET temperature in such a manner that the FET is reliably protected during load dump.

In the protection circuit 10, a zener diode 26 and a diode 26A are connected between the terminals 15 and 17 with the cathode of the zener diode connected to the terminal 15. The anodes of the diodes 26 and 26A are connected together and the cathode of diode 26A is connected to terminal 17. The zener diode 26 ensures that if the FET 11 was receiving an off control signal at the terminal 17 prior to load dump, during load dump the high voltage at the terminal 15 would breakdown the zener diode 26, forward bias diode 26A and provide a sufficient gate voltage to turn the FET on during load dump. While other prior circuits have utilized similar configurations, this circuitry has not always protected the FET sufficiently since the configuration can readily result in substantial current through the FET 11 while the drain-to-gate voltage is maintained at the zener diode breakdown voltage plus one diode drop and the drain-to-source voltage is then typically maintained at about 2 volts more than the drain-to-gate voltage. The end result is substantial current through the FET 11 with a substantial voltage between the drain and source electrodes. This results in substantial power dissipation which can destroy the FET 11 if the load dump transient condition lasts for an extended period of time. Load dump conditions can last for relatively long periods of time and therefore this prior protection circuit, comprising the diode 26, has proved unsatisfactory.

Typically an unloaded load dump voltage of over 80 volts can occur when the voltage V+ corresponds to the alternator output terminal of a vehicle battery charging system in an automobile. With the zener diode 26 having a typical value of 28 volts, this will result in a drain-to-source voltage of 30 volts during load dump. Since the motor load 12 typically has a very low impedance of the order of less than one ohm, a substantial current can flow through the FET during load dump resulting in damage to the FET for a long load dump transient. This can occur even if the zener diode 26 turns the FET on and keeps it on during load dump. Also, when the FET is turned on, the voltage at the terminal 15 may now drop abruptly and this may result in stopping the breakdown of zener diode 26. The end result can be periodic switching of the FET on and off during load dump. During these switching transients large average drain-to-source voltages and large average currents can exist which result in excessive power dissipation of the FET that can readily result in damage to the FET. The present invention prevents this type of excessive power dissipation of the FET during load dump. This is accomplished in the following manner.

Power to the control circuit 24, which corresponds to an IC, is received at an external input terminal 27 which is directly connected to the power supply terminal 16. A control output provided by the control circuit 24 is provided at an external terminal 28 which is directly connected to the terminal 17. The terminals 19 and 20 of the temperature sensing diode 13 are connected to external terminals 29 and 30 of the control circuit 24. An adjustable or selectable resistor 31 is provided external to the control circuit 24 and between the terminals 20 and 30 and a direct electrical connection is provided between the terminals 19 and 29. Ground potential is provided to the control circuit 24 by an external terminal 32 which is directly connected to the ground terminal 23. The internal structure of the control circuit 24 will now be described.

The external input terminal 25 is connected as an input to an AND gate 33 that provides an output at a terminal 34 which serves as an input to an OR gate 35. The OR gate 35 provides an output at a terminal 36 that is connected as an input to a charge pump circuit 37 whose output is directly connected to and provided at the terminal 28. For a positive (high) logic signal at terminal 36, charge pump 37 will provide a high voltage at terminal 28 to fully turn on the FET 11. Diode 26A prevents this high voltage at terminal 28 from being shorted to the V+ voltage at terminal 16.

Semiconductor device overtemperature turn-off circuitry is provided within the control circuit 24 and comprises the following components. At a terminal 38 a stable reference voltage $V_{REF}$ is provided. The terminal 38 is coupled through an integrated circuit resistor 39 to a terminal 40 at which a reference potential $V_1$ is provided. A resistor 41 is provided between the terminal 40 and a terminal 42 at which a reference voltage $V_2$ is provided and a resistor 43 is connected between the terminal 42 and ground potential. The components 38-43 form a resistor divider which provides reference voltages $V_1$ and $V_2$ with a predetermined difference relationship therebetween. The terminal 40 is directly connected to the positive input of a comparator 44 whose output is coupled through an inverter 45 as an input to the AND gate 33. A resistor 46 is provided between the positive input of the comparator 44 and its output to provided a degree of hystersis with regard to the switching threshold of this comparator. A negative input terminal of the comparator 44 is directly connected to the terminal 29 and a constant current source 47 is connected between the terminals 27 and 29 and provided within the integrated circuit 24. The terminal 30 is directly connected to the terminal 32. This configuration, as described above, comprises a portion of the control circuit 24 wherein an adjustable temperature variable signal at terminal 29 is provided related to the temperature of the FET 11 and this signal is utilized to implement the turning off of the FET 11 for sensed FET temperatures above 150° C. This occurs in the following manner.

If a high or positive logic signal is provided at the input terminal 25, this indicates that it is desired to turn on the FET 11. This signal is received by the AND gate 33 and will be passed through to the charge pump 37 if the temperature of the FET is below 150° C. The constant current source 47 provides a known predetermined current through the temperature sensing diode 13 and the adjustable/selectable resistor 31 to ground. With this configuration, the voltage at the terminal 19 varies in accordance with the temperature of the FET 11, and this voltage can be adjusted by the selection of the magnitude of the resistor 31. This occurs because it is known that the voltage across a polysilicon diode, such as the diode 13, varies in a known predetermined manner in accordance with the temperature of such a diode, and the diode temperature will correspond to the FET temperature.

In the present case, due to the close thermal coupling of the diode 13 and the FET 11, the diode 13 provides a temperature sense voltage at the terminal 19 related to the temperature of the FET 11. The resistor 31 permits external, with respect to the control circuit 24, adjustment of the absolute magnitude of this voltage. It should be noted that the voltage across the temperature sensing diode 13 will, as is known, vary inversely with respect to the temperature of the diode 13 such that the voltage across the diode 13 will have a negative TC. The magnitude of the resistor 31 is selectively adjusted such that at a FET temperature of 150° C., the voltage at the terminal 29 will equal the voltage $V_1$. Thus for temperatures above 150° C. the comparator 44 will provide a positive output which, via the inverter 45, prevents the AND gate 33 from passing the external control signal at the terminal 25 to the OR gate 35. As the temperature of the FET 11 goes up, the voltage at the terminal 29 will decrease. When the FET reaches or exceeds a temperature of 150° C., the comparator 44 will prevent the signal at the terminal 25 from providing a positive logic input to the charge pump 37 and therefore prevent this signal from turning on the FET. This configuration generally corresponds to the prior overtemperature turn-off circuitry used in previous circuits, except that the providing of the resistor 31 external to the control circuit IC allows an external adjustment of the switching threshold to provide greater accuracy for the turn-off protection feature of the present invention. The resistor 46 is used to provide some hystersis such that rapid oscillating switching of the comparator 44 between its high and low output states will not occur for very minor changes in temperature of the FET 11 and temperature sensing diode 13.

While overtemperature turn-off circuitry similar to that described above has been provided in previous circuits, a major feature of the present invention is to effectively turn-on the FET 11, at least during load dump, if excessive power dissipation, as indicated by temperature, of the FET 11 is sensed despite the operation of the overtemperature shut-off circuitry. This occurs in the following manner.

The control circuit 24 includes a maximum temperature comparator 50 having a positive input thereof directly connected to the terminal 42 and a negative input thereof connected through a resistor 51 to the terminal 29. The output of the comparator 50 is provided as an additional input to the OR gate 35. This configuration ensures that the charge pump 37 will receive an on control signal input if the temperature of the FET 11 exceeds a maximum threshold temperature of 160° C. despite the operation of the 150° C. temperature shut-off circuitry that includes the comparator 44 and AND gate 33. This is believed to be contrary to all prior circuits wherein this maximum temperature threshold of 160° C. is above the turn off temperature of 150° C. and is close to the maximum rated junction temperature of 175° C. for the FET 11. The term "close to the maximum rated junction temperature", is used to indicate a device temperature of at least more than 30° C. below the maximum rated junction temperature of the FET 11. The significance of this is that if the power dissipation, and therefore the temperature, of the FET 11 is exceeded despite the operation of the overtemperature shut-off circuitry comprising the comparator 44 and AND gate 33, then the comparator 50 will cause the charge pump 37 to turn-on the FET so as to increase conduction therethrough and thereby attempt to minimize power dissipation of the FET 11. This will occur anytime the temperature of the FET 11 exceeds the maximum temperature threshold of 160° C. This is best understood by referring to the circuitry in FIG. 1 in conjunction with the graphs shown in FIGS. 2A-2E which demonstrate operation of the present invention during load dump.

Figure 2A:
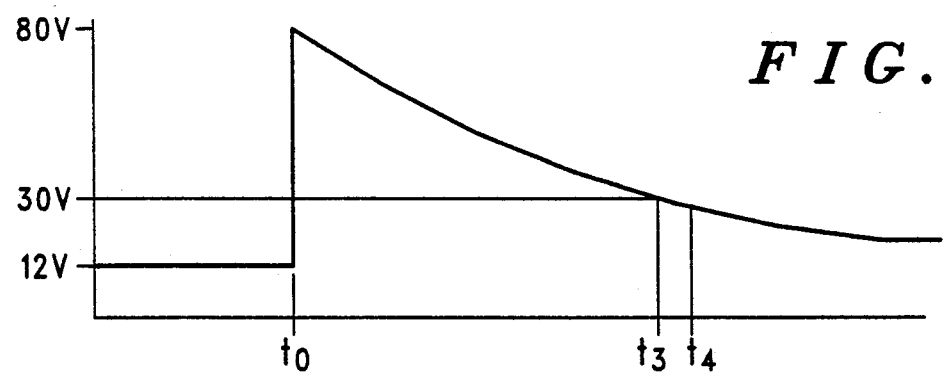
FIGS. 2A-2E are a series of graphs which illustrate waveforms for various electrical signals produced by the circuit in FIG. 1.

Referring to FIG. 2A, a graph of the unloaded voltage $V+$ at the terminal 16 is illustrated. Prior to a time $t_0$, the magnitude of the voltage $V+$ is maintained at positive 12 volts since this voltage corresponds to the regulated battery voltage of an alternator charging system in a vehicle. At the time $t_0$, load dump occurs. In an alternator charging system, this can occur due to the sudden removal of a resistive load from the alternator charging system. In such a case, there is an extremely rapid increase in the voltage $V+$ to some maximum value, such as 80 volts. This increase can exist for a substantial period of time. If protection circuitry were not provided this increase can result in junction breakdown of the FET and/or excessive power dissipation resulting in the permanent destruction of the FET 11. FIG. 2A illustrates the unloaded load dump voltage which would exist at terminal 16 if the FET 11 never conducted current and the zener diode 26 did not breakdown. However, when the voltage $V+$ increases to beyond the breakdown voltage of the zener diode 26, this diode will breakdown and provide a biasing voltage at the gate of the FET 11. Subsequently, the FET 11 will turn-on and typically a 2 volt on bias will exist between the gate and source electrodes of the FET 11 resulting in a 30 volt drain-to-source voltage across the FET 11. With the FET 11 turned on, current will then flow through the motor load 12 wherein the load 12 is assumed to be less susceptible to load dump overcurrent and overvoltages such that it can more readily survive excessive voltage and current transients. It is assumed that only a negligible voltage drop will exist across the motor load 12 due to its low resistance.

Figure 2B:
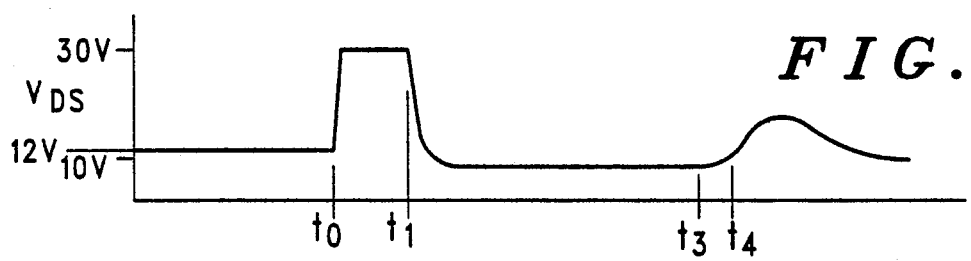

While the zener diode 26 will prevent undesired avalanche breakdown of the FET 11 which could destroy this device, it still provides a substantial 30 volt drain-to-source voltage across the FET after time $t_o$. This is illustrated in FIG. 2B which represents the drain-to-source voltage ($V_{DS}$) of the FET as a function of time. This substantial drain-to-source voltage, coupled with the substantial through current that will flow through the FET, results in substantial power dissipation for the FET. This in turn results in the FET junction temperature rapidly increasing during load dump. This temperature increase is shown in FIG. 2C wherein prior to time $t_0$ the temperature of the FET ($T_{FET}$) is $T_{AMB}$, and this rapidly increases until at a subsequent time $t_1$ a temperature of 160° C. is achieved which is close to the maximum rated junction temperature of the FET.

If the external control signal at the terminal 25 were such that the FET 11 was suppose to be on, as the FET temperature exceeded 150° C., the overtemperature shut-off circuitry, comprising the comparator 44 and AND gate 33, would result in the charge pump 37 being effectively turned off at 150° C. However, the signal waveforms in FIGS. 2A-2E illustrate the case where the control signal at the terminal 25 does not try to maintain the FET on prior to or during load dump. In such a case, as the temperature of the FET exceeds 160° C., the comparator 50 will now turn on the charge pump 37. This results in essentially turning on the FET 11 harder, since the FET was already turned on by the zener diode 26. Turning the FET 11 on "harder" increases its conduction since the charge pump output will effectively fully enhance (turn on) the FET by providing a substantial bias potential at the gate electrode of the FET. This increases FET conduction without maintaining the drain-to-gate potential at the breakdown voltage of the zener diode 26. With the FET fully enhanced, the drain-to-source voltage of the FET will now drop to no more than 10 volts. This will result in lower power dissipation for the FET since now a lower drain-to-source voltage is provided. This occurs subsequent to the time $t_1$ when the temperature of the FET reaches its 160° C. threshold value.

Figure 2C:
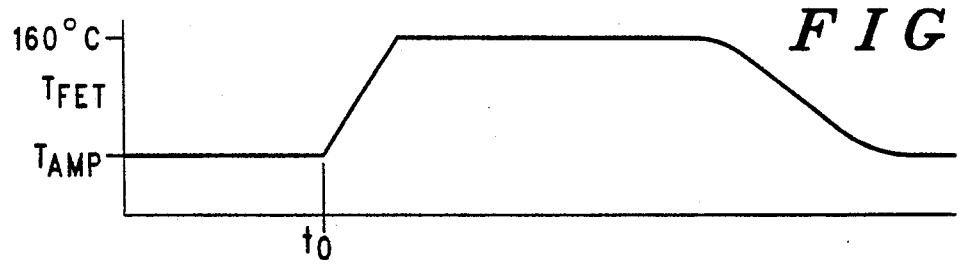
Figure 2D:
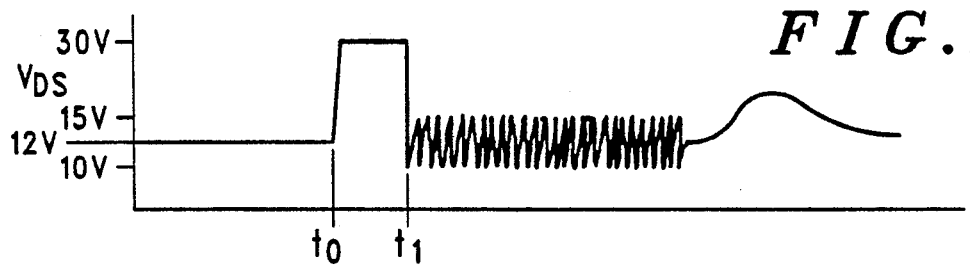
Figure 2E:
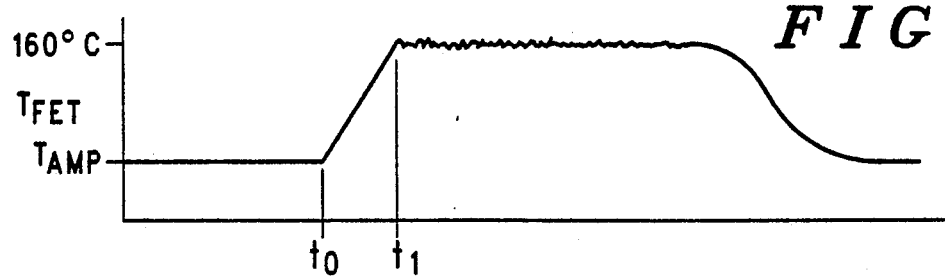

After the time $t_1$, several different types of operation can occur and some of these are generally depicted in the waveforms shown in FIGS. 2B-2E. FIGS. 2B and 2C show operation of the circuit 10 for a load 12 which is primarily a large inductance, while FIGS. 2D and 2E are representative of circuit operation for a purely resistive load 12. For an inductive load, currents through the load 12 and the FET 11 tend to remain the same despite any tendency of the FET 11 to start to turn off during load dump. Thus changes in $V_{DS}$ and $T_{FET}$ are minimized and occur at a slower rate. During the enhanced mode of conduction after $t_1$, FET power dissipation is less and there is no further increase in the FET temperature. If the FET starts to cool below 160° C., the FET starts to come out of its fully enhanced mode due to the charge pump 37 starting to turn off. This again increases power dissipation and FET temperature such that a 160° C. FET temperature is substantially maintained during load dump till a time $t_4$. At the time $t_4$ the V+ voltage at the terminal 16 has fallen to such a low voltage during load dump that starting to bring the FET 11 out of its fully enhanced conduction will no longer result in increasing FET temperature. The FET temperature will then go below the 160° C. threshold of comparator 50 and the comparator will now no longer result in the charge pump 37 fully enhancing the FET. The FET 11 will then turn-off, assuming no turn-on input at the terminal 25, and the FET temperature will continue to cool off to ambient temperature. However, during the time from $t_1$ to $t_4$, the protection circuit 10 has prevented excessive power dissipation in the FET by turning on the FET harder during a load dump condition and therefore minimizing the power dissipation of the FET. It should be noted that just keeping the FET off during the entire load dump condition would not protect the FET since then the excessive voltage at the terminal 16 would cause breakdown of the internal junction diodes of the FET resulting in destruction of this device.

For FIGS. 2B and 2C, current through the FET 11 tends to remain the same due to the inductive load 12. Thus as $V_{DS}$ tends to increase when FET 11 starts to turn off during load dump, power dissipation increases due the FET 11 current not decreasing instantly. For a purely resistive load, FET current decreases as $V_{DS}$ starts to increase during load dump. Thus the graphs in FIGS. 2D and 2E exhibit substantially more ripple for $V_{DS}$ and $T_{FET}$, but operation is still essentially the same. In FIG. 2D $V_{DS}$ varies between 15 and 10 volts during load dump.

It should be noted that in certain situations, when the FET 11 is fully enhanced the voltage at the terminal V+ during load dump may fall to such a degree that the control circuit 24 will not receive sufficient potential at its terminal 27 for the charge pump 37 to keep the FET 11 on. However, as the FET 11 then starts to turn off, the voltage at the terminal V+ will then increase just enough to again render the control circuit 24 operative so that the charge pump 37 can turn the FET 11 back on. Thus during the time t1 through t4 there may be a ripple voltage for $V_{DS}$ with the minimum voltage being the fully enhanced $V_{DS}$ on voltage of the FET and the maximum voltage being at least the minimum voltage at terminal 16 at which the control circuit 24 will properly operate at.

In FIG. 1, components 60 to 63 are illustrated as being connected in dashed form to other circuitry in FIG. 1. If connected these components implement an overcurrent turn-off function in addition to the over temperature turn-off function implemented if FET temperature exceeds 150° C. In such a configuration, the direct connection 22 is replaced by a current sensing resistor 60 and the terminal 21 is connected to the positive input of a comparator 61 that receives a maximum current reference voltage $I_{max}$ at its negative input terminal. A hysteresis resistor 62 is connected between the positive input and output of the comparator 61, and the output is coupled through an inverter stage 63 as an additional input to the AND gate 33.

It is apparent that the configuration of the components 60 to 63 will interrupt the external control signal at the terminal 25 in case excessive current is sensed.

However, the turn-off function of maximum current implemented by the components 60 through 63 is effectively overridden by the turn-on function for temperatures above 160° C. implemented primarily by the comparator 50. This is similar to the way the comparator 50 effectively overrides the temperature turn off function of the comparator 44.

If desired the configuration of the circuit 10 could be altered such that the current turn-off function of comparator 61 would override the temperature turn-on function implemented by the comparator 50. This would just involve coupling the output of the comparator 50 to the OR gate 35 through an additional AND gate which would receive another input from the output of inverter 63. If the current maximum $I_{max}$ is actually such a large current that any current above this maximum would destroy circuit paths or wire bonds relating to the FET 11, then this latter configuration would be desired. However, typically the maximum current $I_{max}$ is just another measure of excessive power dissipation, similar to the 150° C. power dissipation level, and therefore the output of the inverter 63 should be connected as an additional input to the AND gate 33.

Figure 3:
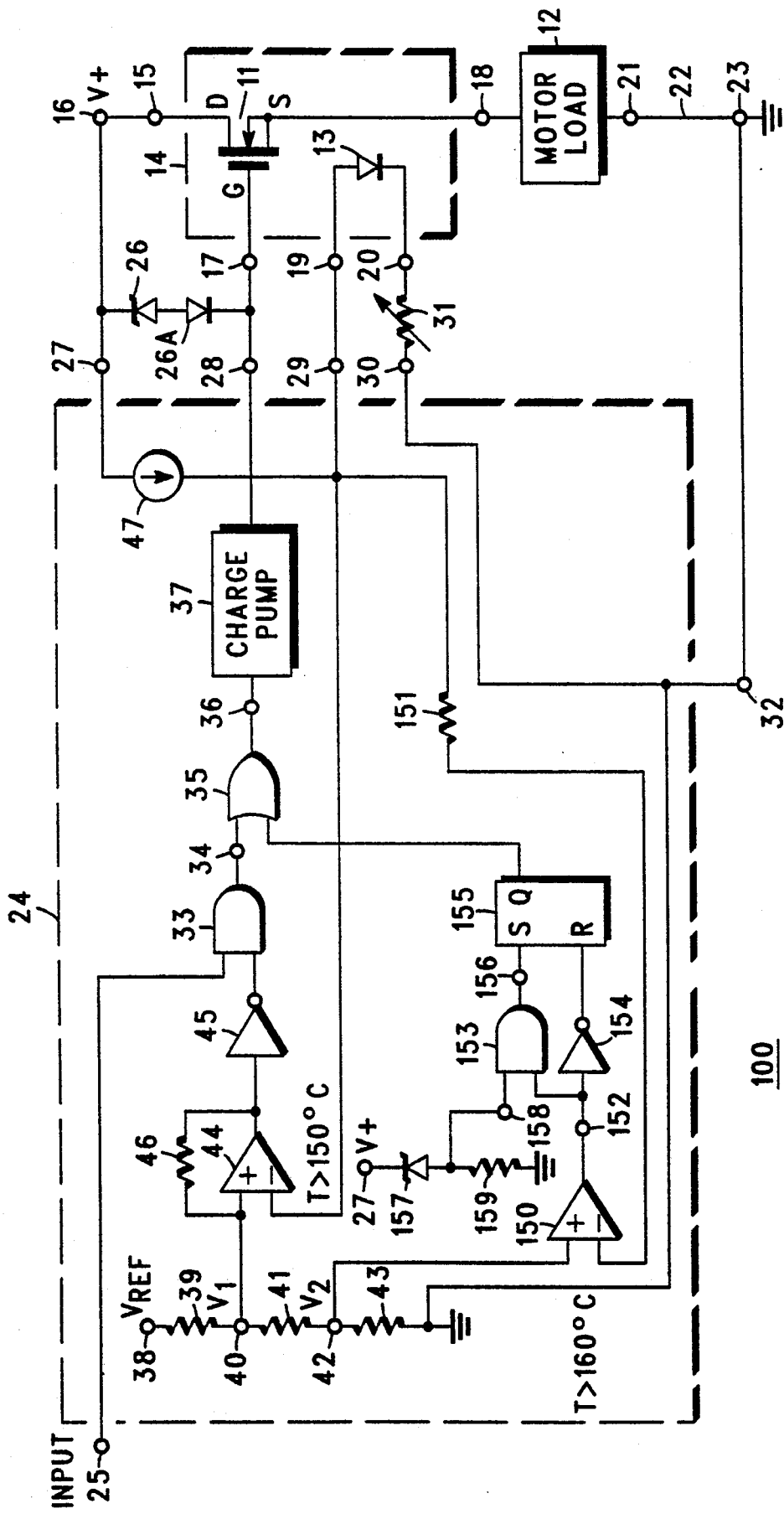
FIG. 3 is a schematic diagram of an alternative embodiment for a semiconductor device protection circuit similar to that shown in FIG. 1.

While the circuit of FIG. 1 comprises the preferred embodiment for the present invention, an alternative circuit 100 is illustrated in FIG. 3 in which all of the elements 11 through 47 in FIG. 1 are reproduced and are identical in function and configuration. However, in FIG. 3 instead of the comparator 50 a different configuration for the overtemperature turn-on circuitry of the present invention is implemented. In FIG. 3, the overtemperature threshold voltage $V_2$ at the terminal 42 is provided as an input to the positive input of a comparator 150 which has its negative input connected through a resistor 151 to the terminal 29. The output of the comparator 150 is provided at a terminal 152 which is provided as an input to an AND gate 153 and coupled through an inverter 154 to a reset terminal R of a set/reset flip-flop 155. The output of the AND gate 153 is provided at a terminal 156 which is connected to a set terminal S of the flip-flop 155, and an output Q of the flip-flop is directly connected as an input to the OR gate 35. A 28 volt zener diode 157 is connected between the V+ terminal 27 and a terminal 158 connected as an input to the AND gate 153. A resistor 159 is connected between the terminal 158 and ground potential.

Essentially, the components 150 through 159 in FIG. 3 implement an overtemperature turn-on function for the circuit 100. While the temperature is below 160° C., the comparator 150 will produce a low logic state at the terminal 152 resulting in maintaining the flip-flop 155 at its reset state during which the flip-flop output Q is maintained at a low logic state. During a condition of load dump, the zener diode 157, as is the case with the zener diode 26, will breakdown due to the large voltage at the terminal V+. This results in a high logic input at the terminal 158. When during such a load dump condition, the temperature of the FET 11 exceeds 160° C. (corresponding to the threshold voltage $V_2$), the comparator 150 will produce a high logic state at the terminal 152 resulting in the setting of the flip-flop output Q high. This results in activating the charge pump 37 so as to ensure that the FET 11 is turned on in a fully enhanced mode of conduction. The output of the flip-flop 155 will remain high, regardless of the continued breakdown of the zener diode 157, until the temperature of the FET 11 falls below the switching level of the comparator 150.

The particular circuit configuration shown in FIG. 3 for the overtemperature turn-on feature may be used in certain circumstances, but the circuit in FIG. 1 is preferred. For the FIG. 3 circuit 100, if the V+ voltage falls below the voltage necessary for the control circuit 24 to function, now V+ must again exceed the breakdown of the diode 157 before the FET 11 can be fully enhanced. Thus a larger $V_{DS}$ ripple will be provided and this could result in excessive FET power dissipation resulting in destruction of the FET.

For both of the circuits 10 and 100, the following advantageous feature is provided. Adjustment of the external resistor 31 adjusts the magnitude of the temperature variable signal at the terminal 29. This not only allows the adjustment of the maximum turn-off FET temperature corresponding to the 150° C. threshold for the FET 11, but also allows the simultaneous adjustment of the maximum turn-on temperature threshold utilized by the comparators 50 and 150. If desired, each of these thresholds could be separately adjusted by suitable modification of the control circuit 24 and/or providing an additional output terminal and additional adjustable resistors external to the control circuit 24. However, use of the single external adjustment resistor 31 to adjust the single FET temperature sense signal at terminal 29 used by both of the turn on and turn off temperature comparators insures that adjustment of the resistor 31 will maintain a predetermined relationship between the turn on and turn off temperatures. Namely that the turn on temperature threshold (160° C.) will always exceed the turn off threshold (150° C.), despite resistor 31 adjustment. Use of a single resistor divider for providing the voltages $V_1$ and $V_2$ also insures this result.

While I have shown and described specific embodiments of this invention, further modifications and improvements will occur to those skilled in the art. All such modifications which retain the basic underlying principles disclosed and claimed herein are within the scope of this invention.

We claim:

1. A semiconductor device protection circuit comprising:
    semiconductor device for receiving at least one device control signal at a control electrode and, in response thereto, selectively passing current through the device between a pair of output electrodes of the device;
    temperature sense means coupled to said device for developing a temperature sense signal having a magnitude indicative of the temperature of said device; and
    control means coupled to said temperature sense means for receiving said temperature sense signal and an external control signal and selectively determining said device control signal in accordance therewith;
    wherein the improvement comprises said control means including means for protecting said device by increasing on conduction of said device in response to said temperature sense signal indicating the temperature of the device exceeds a first high temperature threshold close to the maximum rated junction temperature of said device.

2. A semiconductor device protection circuit according to claim 1 wherein said protecting means includes means for decreasing power dissipation of said device during load dump by increasing on conduction of said device during load dump in response to said sensed device temperature exceeding said first high temperature threshold.

3. A semiconductor device protection circuit according to claim 2 wherein said protecting means includes load dump means for initially detecting load dump and turning said device on in response thereto, said decreasing power dissipation means being operative to reduce device power dissipation at least after said load dump means turns said device on.

4. A semiconductor device protection circuit according to claim 3 wherein said load dump means includes a zener diode connected between one of said output electrodes of said device and said control electrode of said device.

5. A semiconductor device protection circuit according to claim 1 wherein said device first high temperature threshold which is close to the maximum rated junction temperature is above 30° C. below the maximum rated junction temperature of said device.

6. A semiconductor device protection circuit according to claim 1 wherein said control means includes off means for turning said device off in response to the temperature of said device exceeding a second predetermined high temperature threshold which is lower than said first high temperature threshold, said control means turning said device on if the temperature of said device exceeds both of said second and first high temperature thresholds.

7. A semiconductor device protection circuit according to claim 1 wherein said protecting means includes load dump means for initially detecting load dump and turning said device on in response thereto, said protecting means being operative to reduce power dissipation of said device produced during operation of said load dump means during load dump in response to said sensed device temperature exceeding said first high temperature threshold.

8. A semiconductor device protection circuit comprising:
   semiconductor device for receiving at least one device control signal at a control electrode and, in response thereto, selectively passing current through the device between a pair of output electrodes of the device;
   temperature sense means coupled to said device for developing a temperature sense signal having a magnitude indicative of the temperature of said device; and
   control means coupled to said temperature sense means for receiving said temperature sense signal and an external control signal and selectively determining said device control signal in accordance therewith;
   wherein the improvement comprises said control means including load dump means for sensing a load dump condition and turning said device on in response thereto and additional means for determining said control signal such that said device is on in response to said sensed device temperature exceeding a first predetermined high temperature threshold.

9. A semiconductor device protection circuit according to claim 8 wherein said control means also includes off means for turning said device off in response to the temperature of said device exceeding a second predetermined high temperature threshold which is lower than said first high temperature threshold, said control means turning said device on during load dump if the temperature of said device exceeds both of said second and first high temperature thresholds.

10. A semiconductor device protection circuit according to claim 9 wherein said control means off means includes means which receives said external control signal, but prevents said external control signal from determining said device control signal whenever the temperature of said device exceeds said second high temperature threshold.

11. A semiconductor device protection circuit according to claim 10 wherein said control means prevention means comprises logic circuitry which receives as inputs both said external control signal and the output signal of a comparator which output is indicative of said device temperature exceeding said second high temperature threshold.

12. A semiconductor device protection circuit according to claim 8 wherein said load dump means comprises a zener diode connected between one of said output electrodes of said device and said control electrode of said device.

13. A semiconductor device protection circuit comprising:
   semiconductor device for receiving at least one device control signal at a control electrode and, in response thereto, selectively passing current through the device between a pair of output electrodes of the device;
   temperature sense means coupled to said device for developing a temperature sense signal having a magnitude indicative of the temperature of said device; and
   control means coupled to said temperature sense means for receiving said temperature sense signal and an external control signal and selectively determining said device control signal in accordance therewith;
   wherein the improvement comprises said control means including load dump means for sensing the occurrence of load dump and turning said device on in response thereto and means for turning said device on harder, thus decreasing power dissipation in said device, during load dump and in response to the sensed temperature of said device exceeding a first predetermined high temperature threshold.

14. A semiconductor device protection circuit according to claim 13 wherein said load dump means comprises a zener diode connected between one of said output electrodes of said device and said control electrode of said device.

15. A semiconductor device protection circuit according to claim 14 wherein said turn on harder means reduces the voltage across said output electrodes during load dump to reduce device power dissipation.

16. A semiconductor device protection circuit according to claim 15 wherein said turn-on harder means includes charge pump means for providing a substantial voltage potential at the control electrode of said device in response to the sensed temperature of said device exceeding said first high temperature threshold.

17. A semiconductor device protection circuit according to claim 16 wherein said control means also includes off means for turning said device off in response to the temperature of said device exceeding a second predetermined high temperature threshold lower than said first high temperature threshold, said control means turning said device on during load dump if the temperature of said device exceeds both second and first high temperature thresholds.

18. A semiconductor device protection circuit according to claim 13 wherein said control means also includes off means for turning said device off in response to the temperature of said device exceeding a second predetermined high temperature threshold lower than said first high temperature threshold, said control means turning said device on during load dump if the temperature of said device exceeds both second and first high temperature thresholds.

19. A semiconductor device protection circuit comprising:
   semiconductor device for receiving at least one device control signal at a control electrode and, in response thereto, selectively passing current through the device between a pair of output electrodes of the device;
   temperature sense means coupled to said device for developing a temperature sense signal having a magnitude indicative of the temperature of said device;
   control means coupled to said temperature sense means for receiving said temperature sense signal and an external control signal and selectively determining said device control signal in accordance therewith;
   means for sensing said current passing through said semiconductor device and providing a current sense electrical signal having a magnitude indicative thereof; and
   said control means including means for turning said device off by modifying said device control signal in response to said current through said device exceeding a maximum overcurrent limit;
   wherein the improvement comprises said control means including means for turning said device on in response to the temperature of said device exceeding a first predetermined high temperature threshold despite the current through said device exceeding said maximum overcurrent limit.

20. A semiconductor device protection circuit according to claim 19 wherein said means for turning said device off also includes means for turning said device off in response to the temperature of said device exceeding a second predetermined high temperature threshold lower than said first high temperature threshold, said control means turning said device on if the temperature of said device exceeds both of said second and first high temperature thresholds.

21. A semiconductor device protection circuit according to claim 20 wherein said control means off means includes means which receives said external control signal, but prevents said external control signal from determining said device control signal whenever the temperature of said device exceeds said second high temperature threshold value and whenever the current through said device exceeds said maximum overcurrent limit.

22. A semiconductor device protection circuit according to claim 21 wherein said control means prevention means comprises logic circuitry which receives as inputs said external control signal, the output of a comparator which is indicative of said device temperature exceeding said second high temperature threshold and the output of a comparator which is indicative of said current through said device exceeding said maximum overcurrent limit.

23. A semiconductor device protection circuit comprising:
   semiconductor device for receiving at least one device control signal at a control electrode and, in response thereto, selectively passing current through the device between a pair of output electrodes of the device;
   temperature sense means coupled to said device for developing a temperature sense signal having a magnitude indicative of the temperature of said device; and
   control means coupled to said temperature sense means for receiving said temperature sense signal and selectively modifying said device control signal in response to said sensed device temperature exceeding a temperature threshold;
   wherein the improvement comprises a majority of said control means being provided on a control integrated circuit and means, external to said integrated circuit, for allowing external adjustment of the device temperature at which said control means will modify said device control signal which controls said device through current.

24. A semiconductor device protection circuit according to claim 23 wherein said temperature sense means includes a temperature sensing diode positioned adjacent said semiconductor device and wherein said external adjustment means comprises at least one resistor external to said integrated circuit.

25. A semiconductor device protection circuit according to claim 24 wherein said external resistor is connected in series with said temperature sensing diode and said external resistor has a magnitude which determines said temperature sense signal magnitude.

26. A semiconductor device protection circuit according to claim 24 wherein said external resistor is adjustable.

27. A semiconductor device protection circuit comprising:
   semiconductor device for receiving at least one device control signal at a control electrode and, in response thereto, selectively passing current through the device between a pair of output electrodes of the device;
   temperature sense means coupled to said device for developing a temperature sense signal having a magnitude indicative of the temperature of said device; and
   control means coupled to said temperature sense means for receiving said temperature sense signal and selectively modifying said device control signal in response to said sensed device temperature exceeding a temperature threshold;
   wherein the improvement comprises a majority of said control means being provided on a control integrated circuit and means, external to said integrated circuit, for allowing external adjustment of the device temperature at which said control means will modify said device control signal, and wherein said control means increases on conduction of said device in response to the temperature of said device exceeding said threshold.

28. A semiconductor device protection circuit comprising:
   semiconductor device for receiving at least one device control signal at a control electrode and, in response thereto, selectively passing current through the device between a pair of output electrodes of the device;

temperature sense means coupled to said device for developing a temperature sense signal having a magnitude indicative of the temperature of said device; and control means coupled to said temperature sense means for receiving said temperature sense signal and selectively modifying said device control signal in response to said sensed device temperature exceeding a temperature threshold;

wherein the improvement comprises a majority of said control means being provided on a control integrated circuit and means, external to said integrated circuit, for allowing external adjustment of the device temperature at which said control means will modify said device control signal, and wherein said control means turns said device off in response to the temperature of said device exceeding said threshold.

29. A semiconductor device protection circuit comprising:

semiconductor device for receiving at least one device control signal at a control electrode and, in response thereto, selectively passing current through the device between a pair of output electrodes of the device;

temperature sense means coupled to said device for developing a temperature sense signal having a magnitude indicative of the temperature of said device; and control means coupled to said temperature sense means for receiving said temperature sense signal and selectively modifying said device control signal in response to said sensed device temperature exceeding a temperature threshold;

wherein the improvement comprises a majority of said control means being provided on a control integrated circuit and means, external to said integrated circuit, for allowing external adjustment of the device temperature at which said control means will modify said device control signal, and wherein said control means utilizes said temperature sense signal magnitude to increase on conduction of said device in response to the temperature of said device exceeding a first temperature threshold and to turn said device off in response to the temperature of said device exceeding a second temperature threshold, lower than said first temperature threshold, said external adjustment means determining said temperature sense signal magnitude.

30. A semiconductor device protection circuit according to claim 29 wherein said first and second temperature thresholds are both determined by voltages derived from a resistor divider circuit on said integrated circuit such that said thresholds have a known relationship therebetween.

* * * * *